United States Patent [19]

Nomura

[11] Patent Number: 5,278,788
[45] Date of Patent: Jan. 11, 1994

[54] SEMICONDUCTOR MEMORY DEVICE HAVING IMPROVED CONTROLLING FUNCTION FOR DATA BUSES

[75] Inventor: Hidenori Nomura, Kasugai, Japan

[73] Assignees: Fujitsu Limited, Kawasaki; Fujitsu VLSI Limited, Kasugai, both of Japan

[21] Appl. No.: 665,865

[22] Filed: Mar. 7, 1991

[30] Foreign Application Priority Data

Mar. 9, 1990 [JP] Japan .................................. 2-58925

[51] Int. Cl.$^5$ .............................................. G11C 7/00
[52] U.S. Cl. ........................... 365/189.01; 365/189.08; 365/189.11; 307/475
[58] Field of Search .................. 307/443, 452, 475; 365/189.01, 189.08, 189.11, 194, 196, 189.06, 189.03, 189.04, 190

[56] References Cited

U.S. PATENT DOCUMENTS 4,945,517 7/1990 Miyatake et al. ............... 365/189.01
5,153,459 10/1992 Park et al. ............................ 365/190

FOREIGN PATENT DOCUMENTS 0037239 10/1981 European Pat. Off. .
0213835  3/1987 European Pat. Off. .
0261609  3/1988 European Pat. Off. .
0262531  4/1988 European Pat. Off. .

Primary Examiner—Timothy P. Callahan
Attorney, Agent, or Firm—Armstrong, Westerman, Hattori, McLeland & Naughton

[57] ABSTRACT

In a semiconductor memory device wherein a difference in potential of two data buses is increased during a write mode and is reduced during a read mode, a write/restoring circuit is provided for carrying out a write operation which increases the difference in potential between the data buses and a restoring operation which reduces the increased difference in potential of the data buses to carry out a read operation after the write operation in accordance with a common write control signal using common output transistors.

11 Claims, 9 Drawing Sheets

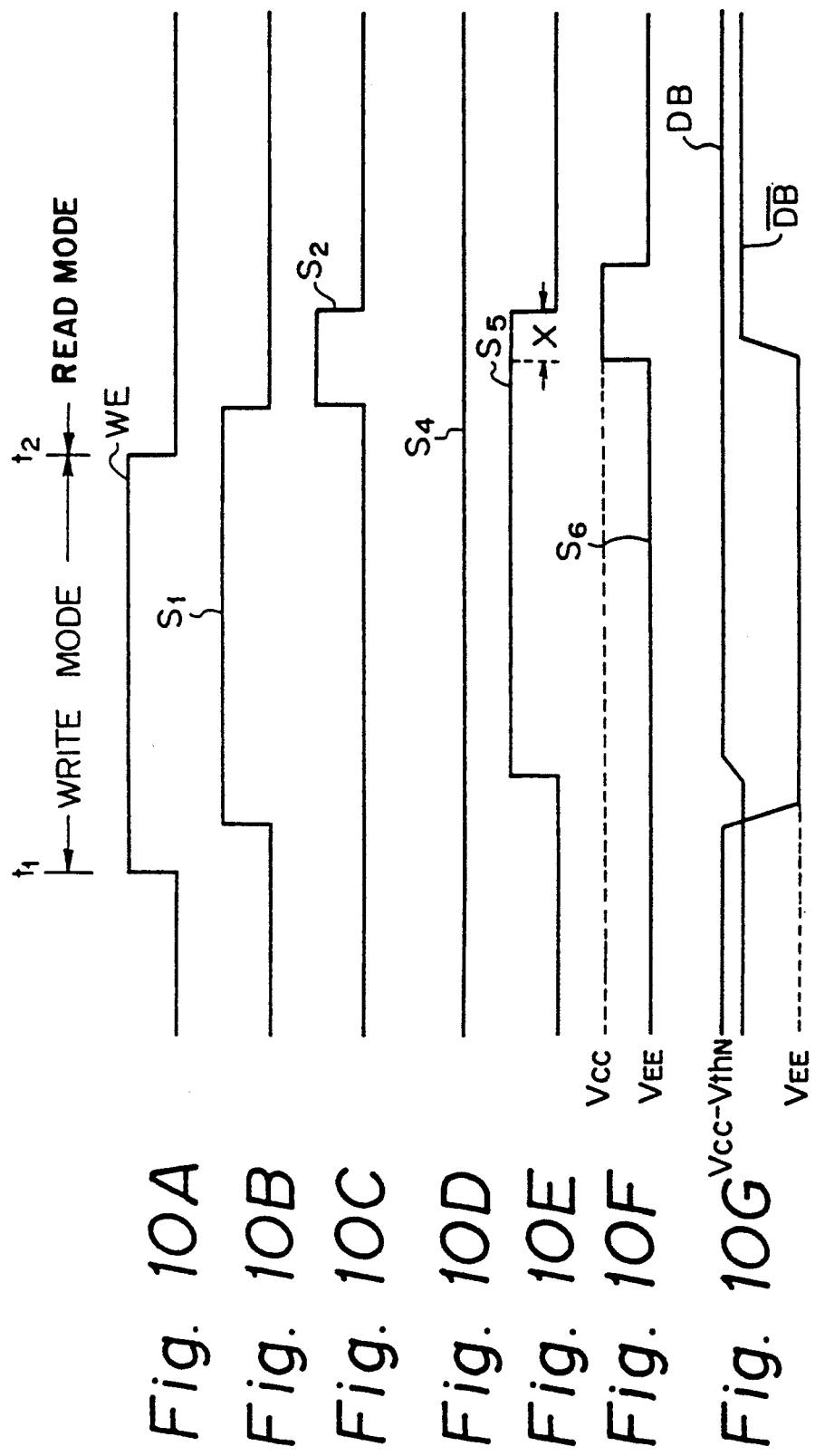

SEMICONDUCTOR MEMORY DEVICE HAVING IMPROVED CONTROLLING FUNCTION FOR DATA BUSES

BACKGROUND OF THE INVENTION

1. Field of the Invention

The present invention relates to a semiconductor memory device wherein a difference in potential of data buses is increased during a write mode and this difference is reduced during a read mode.

2. Description of the Related Art

In a semiconductor memory device such as a MOS dynamic random access memory (DRAM) or a MOS static random access memory (SRAM), two complementary signals are written into or read from a memory cell array via a pair of data buses. During a write mode, the difference in potential of the data buses is increased to effectively carry out a write operation. On the other hand, during a read mode, the difference in potential of the data buses is reduced to improve the speed of a read operation, and the like. For this purpose, in a prior art semiconductor memory device, a write circuit, a restoring circuit, and an amplitude limiting circuit are separately provided. That is, the write circuit is used for enlarging the difference in potential of the data buses during a write mode. Also, the restoring circuit is used for reducing the difference in potential of the data buses when the control enters a read mode from the write mode. Further, the amplitude limiting circuit is used for maintaining the reduced difference in potential of the data buses. This prior art semiconductor memory device will be explained later in detail.

In the above-mentioned prior art, however, since the write circuit and the restoring circuit are separately provided, the entire device must be large, which hinders a high degree of integration of the device. Also, it is difficult to match the operation timing of the write circuit with that of the restoring circuit.

SUMMARY OF THE INVENTION

Therefore, an object of the present invention is to provide a semiconductor memory device which is advantageous in that it has a high degree of integration and the timing of the write circuit is matched with that of the restoring circuit.

According to the present invention, a write/restoring circuit is provided for carrying out a write operation which increases the difference in potential between the data buses and a restoring operation which reduces the increased difference in potential of the data buses to carry out a read operation after the write operation in accordance with a common write control signal (WE) using common output transistors. That is, the write circuit and the restoring circuit are combined as one body.

BRIEF DESCRIPTION OF THE DRAWINGS

The present invention will be more clearly understood with reference to the accompanying drawings, wherein:

FIGS. 10A through 10G are timing diagrams for explaining the operation of the circuit of FIG. 9.

DESCRIPTION OF THE PREFERRED EMBODIMENTS

Before the description of embodiments of the present invention, a prior art semiconductor memory device is explained with reference to FIGS. 1 through 5, and 6A through 6D.

Figure 1:
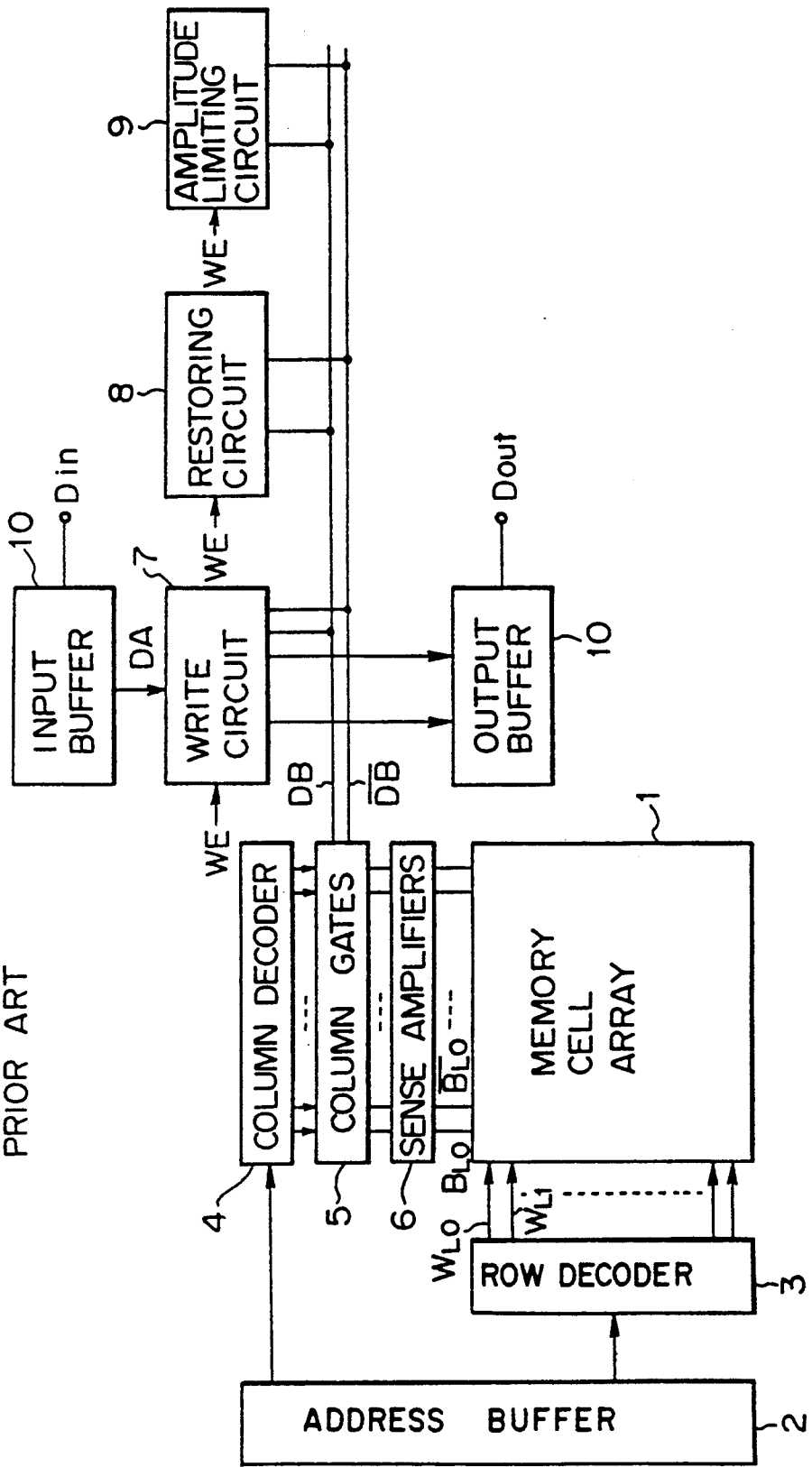
FIG. 1 is a block circuit diagram illustrating a prior art semiconductor memory device.

In FIG. 1, which illustrates a prior art semiconductor memory device, reference numeral 1 designates a memory cell array including a large number of memory cells. An address buffer 2 supplies a row address signal to a row decoder 3 which selects one of word lines $WL_0$, $WL_1$, ..., connected to a row of memory cells of the memory cell array 1. Also, the address buffer 2 supplies a column address signal to a column decoder 4 which selects one pair of gates of column gates 5. The column gates 5 are used for selecting one of bit line pairs $BL_0$, $\overline{BL_0}$, ... to connect them to data buses DB and $\overline{DB}$. Also, each of the bit line pairs is connected to one of sense amplifiers 6 for sensing a difference in potential of the bit line pair.

Next, a portion for controlling the potentials at the data buses DB and $\overline{DB}$ is explained. For this purpose, a write circuit 7, a restoring circuit 8, and an amplitude limiting circuit 9 are connected to the data buses DB and $\overline{DB}$.

The write circuit 1 is used for writing data signal DA, depending on input data supplied to an input buffer 10, into one memory cell of the memory cell array 1. In this case, the difference in potential of the data buses DB and DB is increased to effectively carry out a write operation.

In order to increase the speed of a read operation, the restoring circuit 8 is used for rapidly reducing the difference in potential of the data buses DB and $\overline{DB}$ when the control enters a read mode, and the amplitude limiting circuit 9 is used for maintaining the difference (amplitude) in potential of the data buses DB and $\overline{DB}$. That is, the smaller the amplitude of the potentials of the data buses DB and $\overline{DB}$, the larger the speed of a read operation. Also, when a selection of bit line pairs is carried out to read reverse data, an erroneous write operation can be avoided by reducing the difference in potential of the data buses DB and $\overline{DB}$. Further, an output buffer 10, which may be constructed by a latch circuit, a current mirror circuit, or the like, can be designed to be operated sensitively. Note that $D_{out}$ is output data.

Figure 2:
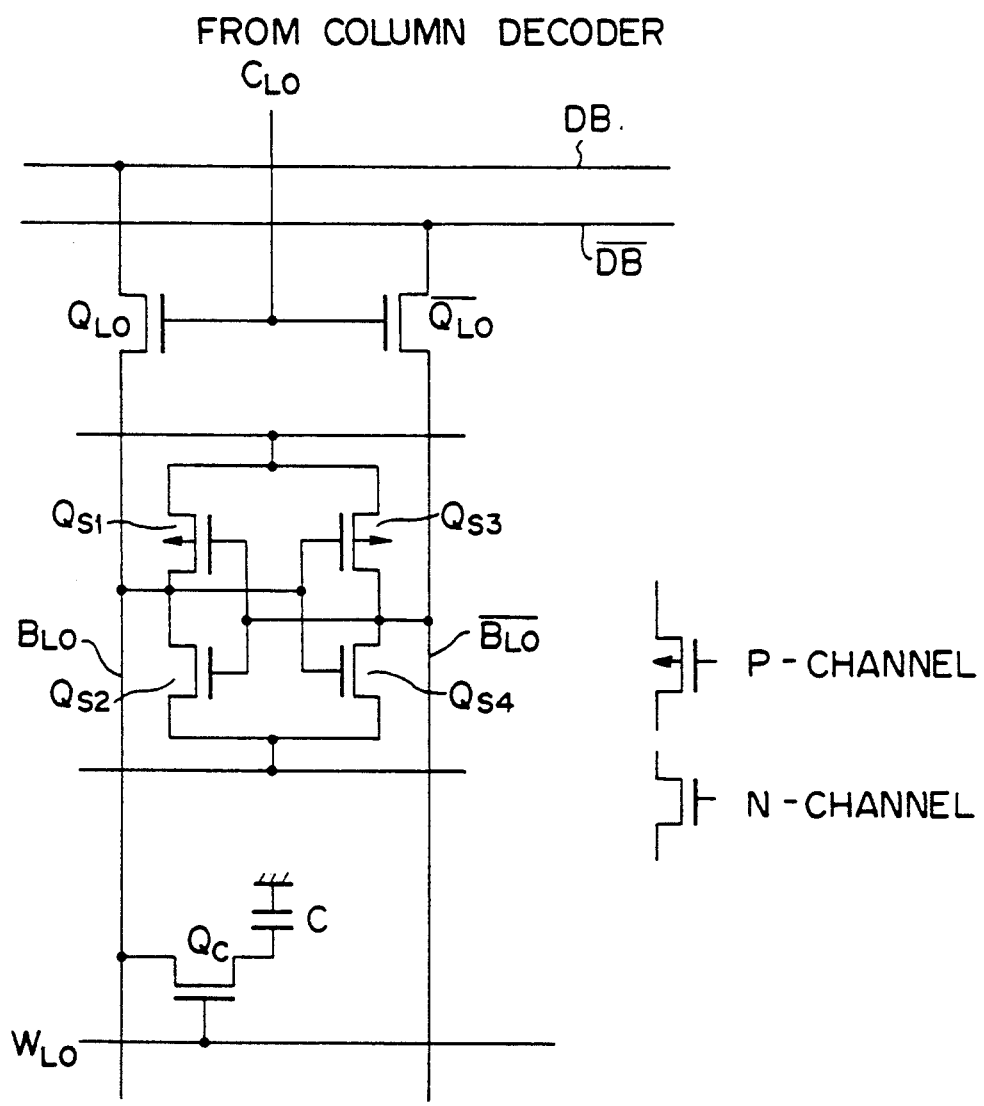
FIG. 2 is a circuit diagram of a part of the device of FIG. 1.

In FIG. 2, which illustrates a part of the device of FIG. 1, $Q_{L0}$ and $\overline{Q}_{L0}$ are N-channel MOS transistors which serve as a pair of gates of the column gates 5. Also, $Q_{S1}$ to $Q_{S4}$ are MOS transistors which serve as one of the sense amplifiers 6. In this case, the transistors $Q_{S1}$ and $Q_{S3}$ are of the P-channel type and the transistors $Q_{S2}$ and $Q_{S4}$ are of the N-channel type. Further, a transistor $Q_C$ and a capacitor C form a memory cell of the memory cell array 1 which is, in this case, of the one-transistor, one-capacitor type. The arrangement memory cells is of the folded-type where a bit line such as $BL_0$ and its complementary bit line such as $\overline{BL_0}$ are arranged on the same side. Note that the shared-type where two complementary bit lines are arranged on the opposite side can also be adopted.

In FIG. 2, during a write mode for the memory cell ($Q_C$, C), the potential at the word line $WL_0$ and the potential at the column selection line $CL_0$ are caused to be high by the row decoder 3 and the column decoder 4, charges are introduced into the capacitor C via the transistors $Q_{L0}$ and $Q_C$ if the potential at the data bus DB is high, and charges are expelled from the capacitor C via the transistors $Q_C$ and $Q_{L0}$ if the potential at the data bus DB is low. In this case, the sense amplifiers are operated. In order to effectively carry out a write operation, it is clear that the amplitude of the data buses DB and $\overline{DB}$ must be large.

On the other hand, during a read mode for the memory cell ($Q_C$, C), the potentials at the word line $WL_0$ and the column selection signal $CL_0$ are made high. Also, in this case, the sense amplifier ($Q_{S1}$ to $Q_{S4}$) is made active, to increase the difference in potential of the bit lines $BL_0$ and $\overline{BL_0}$. However, this difference creates only a small difference in potential of the data buses DB and $\overline{DB}$, due to the operation of the amplitude limiter 9. Therefore, during a read mode, it is impossible to increase the difference in potential of the data buses DB and $\overline{DB}$. If the potential in potential of the data buses DB and $\overline{DB}$ is quite large during a read mode, reverse data may be written into a selected memory cell, when the next column address is supplied to the column decoder 4.

Figure 3:
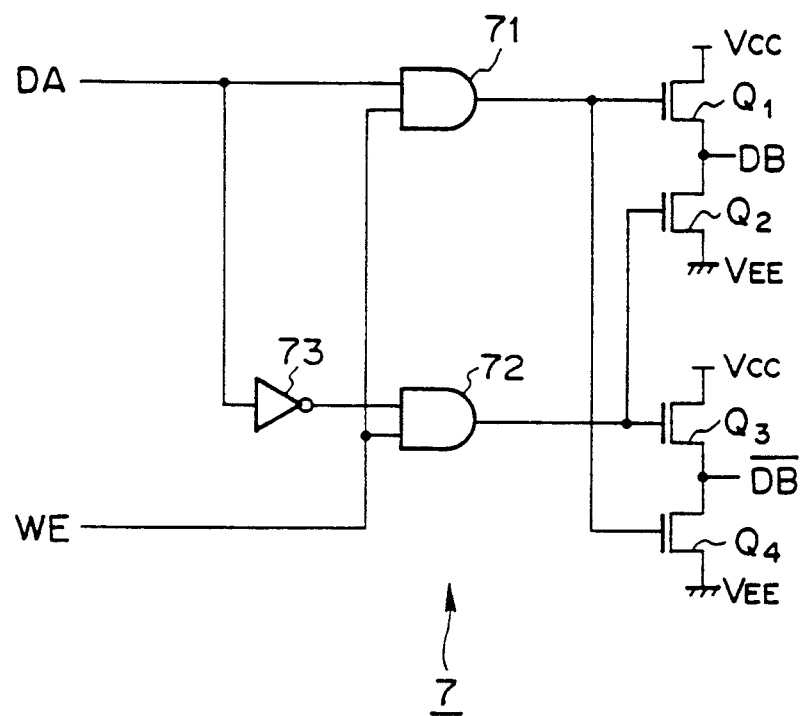
FIG. 3 is a circuit diagram of the write circuit of FIG. 1.

In FIG. 3, which is a circuit diagram of the write circuit 7 of FIG. 1, a push-pull output buffer formed by N-channel transistors $Q_1$ and $Q_2$ is connected to the data bus DB, and a push-pull output buffer formed by N-channel transistors $Q_3$ and $Q_4$ is connected to the data bus $\overline{DB}$. The transistors $Q_1$ and $Q_4$ are driven by an AND circuit 71, and the transistors $Q_2$ and $Q_3$ are driven by an AND circuit 72. Reference numeral 73 designates an inverter.

Figure 6A:
FIGS. 6A through 6D are timing diagrams for explaining the operation of the device of FIG. 1.
Figure 6B:
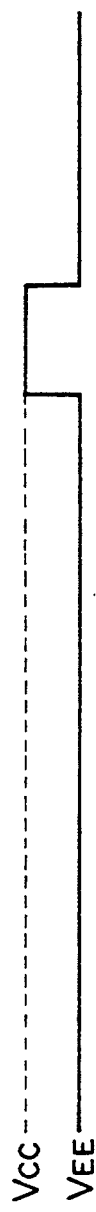
Figure 6C:
Figure 6D:
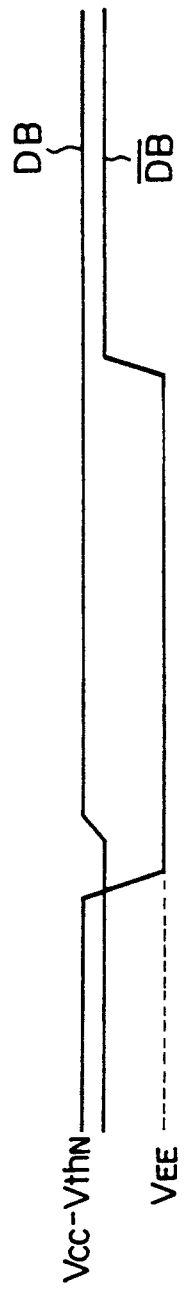

In FIG. 3, a high or low level data signal DA is supplied to an input of the AND circuit 71, while an inverted signal of the data signal DA is supplied to the AND circuit 72. Also, a write control signal WE having a high level during a write mode and a low level during a read mode is supplied to the other inputs of the AND circuits 71 and 72. As a result, when the data signal DA is at the high level and the write control signal WE is at the high level, the AND circuit 71 generates a high level signal to turn ON transistors $Q_1$ and $Q_4$, and the AND circuit 72 generates a low level signal to turn OFF transistors $Q_2$ and $Q_3$. Therefore, an approximately power supply voltage $V_{CC} - V_{thN}$ is generated at the data bus $DB_1$, and a power supply voltage $V_{EE}$ is generated at the data bus DB as shown in FIGS. 6A and 6D. Therefore, the difference in potential between the data buses DB and $\overline{DB}$ is approximately the difference in potential of the power supply voltages $V_{CC} - V_{thN}$ and $V_{EE}$. Note that $V_{thN}$ is a threshold voltage of the N-channel MOS transistors $Q_1$ to $Q_4$.

On the other hand, when the data signal DA is at a low level and the write control signal WE is at the high level, the AND circuit 72 generates a high level signal to turn ON transistors $Q_2$ and $Q_3$, and the AND circuit 7 generates an low level signal to turn OFF transistors $Q_1$ and $Q_4$. Therefore, the potentials at the data buses DB and $\overline{DB}$ are inverted.

Thus, the difference in potential of the data buses DB and $\overline{DB}$ is large during a write mode.

Note that, in a read mode where the write control signal WE is at the low level, the outputs of the AND circuits 71 and 72 are low, and as a result, both of the push-pull output buffers are in a high-impedance state.

Figure 4:
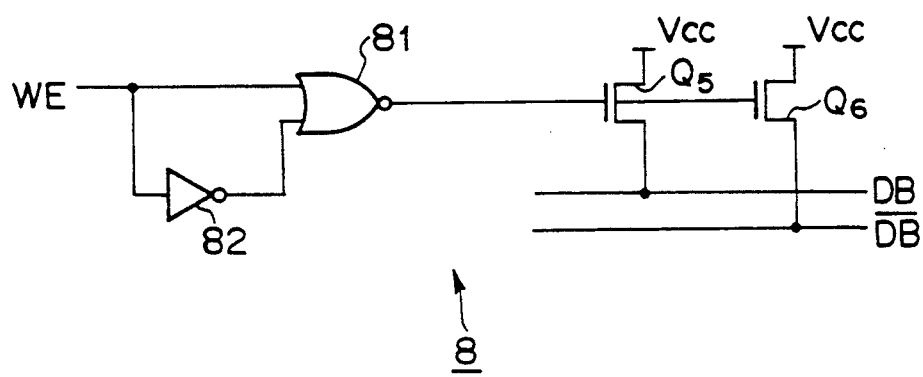
FIG. 4 is a circuit diagram of the restoring circuit of FIG. 1.

In FIG. 4, which is a circuit diagram of the restoring circuit 8 of FIG. 1, N-channel transistors $Q_5$ and $Q_6$, a NOR circuit 81, and an inverter 82 are provided. The write control signal WE is supplied directly to an input of the NOR circuit 81, and is also supplied via the inverter 82 to the other input thereof. The drains of the transistors $Q_5$ and $Q_6$ are connected to the power supply terminal $V_{CC}$, and the sources are connected to the data buses DB and $\overline{DB}$, respectively.

In FIG. 4, even when the write control signal WE having a high level is input during a write mode, the transistors $Q_5$ and $Q_6$ remain OFF. In this state, when the write control signal WE is made low, the NOR circuit 81 generates a high level signal for an operational time period of the inverter 82 as shown in FIG. 6B, to turn ON the transistors $Q_5$ and $Q_6$. As a result, one of the data buses DB and $\overline{DB}$ is pulled up to $V_{CC} - V_{thN}$, and the other is pulled up to about $V_{CC} - V_{thN} - 0.5$ V, as shown in FIG. 6D. Therefore, when the control is moved from a write mode to a read mode, the difference in potential of the data buses DB and $\overline{DB}$ is reduced from the difference between and $V_{CC} - V_{thN}$ and $V_{EE}$ to the difference between $V_{CC} - V_{thN}$ and $V_{CC} - V_{thN} - 0.5$ V. Note that the difference 0.5 V in potential is generated by the operation of sense amplifiers 6, column gates 5, and the amplitude limiting circuit 9. Therefore, the value 0.5 V can be arbitrarily set.

Note that, in a write mode (WE = "1"), the transistors $Q_5$ and $Q_6$ are made OFF.

Figure 5:
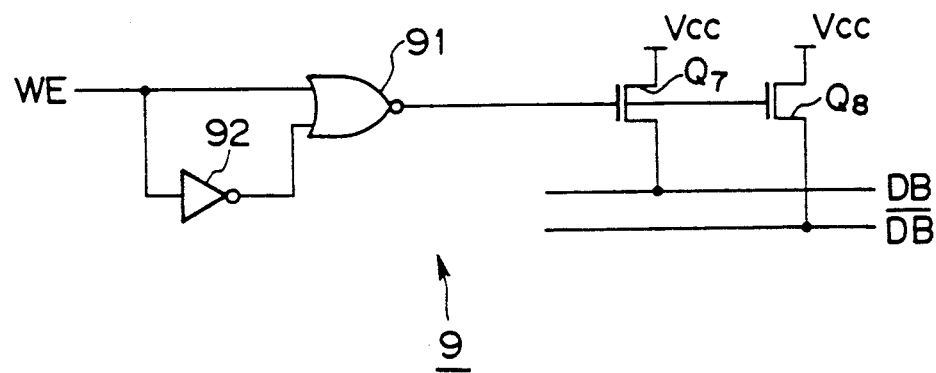
FIG. 5 is a circuit diagram of the amplitude limiting circuit of FIG. 1.

In FIG. 5, which is a circuit diagram of the amplitude limiting 8 of FIG. 1, N-channel transistors $Q_7$ and $Q_8$, a NOR circuit 91, and a buffer 92 are provided. The write control signal WE is supplied directly to an input of the NOR circuit 91, and is also supplied via the buffer 92 to the other input thereof. The drains of the transistors $Q_7$ and $Q_8$ are connected to the power supply terminal $V_{CC}$, and the sources are connected to the data buses DB and $\overline{DB}$, respectively.

In FIG. 4, even when the write control signal WE having a high level is input during a write mode, the transistors $Q_7$ and $Q_8$ remain OFF. In this state, when the write control signal WE is made low, the NOR circuit 91 generates a high level signal for an operational time period of the buffer 92 as shown in FIG. 6C, to turn ON the transistors $Q_7$ and $Q_8$. As a result, the potentials at the data buses $DB_1$ and DB are maintained between $V_{CC} - V_{thN}$ and $V_{CC} - V_{thN} - 0.5$ V as shown in FIG. 6D.

Note that, in a write mode (WE = "1"), the transistors $Q_7$ and $Q_8$ are made OFF, and as a result, the data buses DB and $\overline{DB}$ are in a floating state regarding the transistors $Q_7$ and $Q_8$.

Note that all of the transistors $Q_1$ to $Q_8$ are constructed by N-channel MOS transistors, and particularly, the size of transistors $Q_1$ through $Q_6$ of the write circuit 1 and the restoring circuit 2 must be large enough to increase the speed of operation. For example, the channel width of the transistors $Q_1$ through $Q_6$ are 200 μm, and the channel width of the transistors $Q_7$ and $Q_8$ is 50 μm. Also, the channel width of the other transistors forming the NOR circuits 71, 72, 81, 91, the inverters 73 and 82, and the buffer 92 is relatively small. Thus, the large number of large scale transistors such as $Q_1$ through $Q_6$ reduces the degree of integration.

Also, since the write circuit 7 and the restoring circuit 8 are formed separately, separate connections for supplying the write control signal WE thereto are required, which reduces the degree of integration. Also, it is difficult to match the operation timing of the write circuit 7 with that of the restoring circuit 8.

Figure 7:
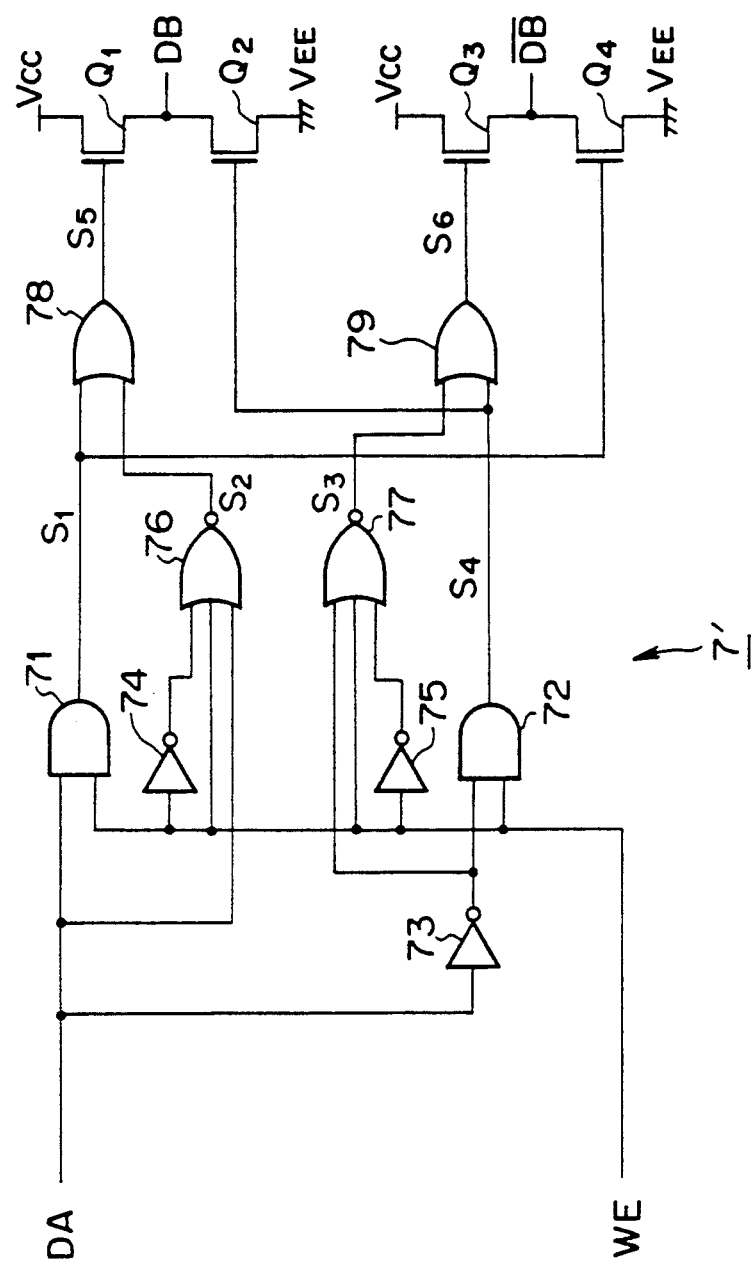
FIG. 7 is a circuit diagram illustrating a first embodiment of the write/restoring circuit according to the present invention.

In FIG. 7, which illustrates a first embodiment of the present invention, reference numeral 7' designates a write/restoring circuit which serves as not only the write circuit 7 of FIG. 1, but also the restoring circuit 8 of FIG. 1. In FIG. 7, inverters 74 and 75, NOR circuits 76 and 77, and OR circuits 78 and 79 are added to the write circuit 1 of FIG. 3.

The inverter 74 and the NOR circuit 76 serves as a fall detecting circuit for detecting a fall in the write control signal when the data signal DA is at the low level. Similarly, the inverter 75 and the NOR circuit 77 serves as a fall detecting circuit for detecting a fall in the write control signal when the data signal DA is at the high level.

The outputs of the fall detecting circuits are supplied via the OR circuits 78 and 79, respectively, to the transistors $Q_1$ and $Q_3$, respectively, thus the circuit 7' of FIG. 7 serves as the restoring circuit 8 of FIG. 4.

The operation of the write/restoring circuit 7' of FIG. 7 will be explained with reference to FIGS. 8A through 8H.

Figure 8:
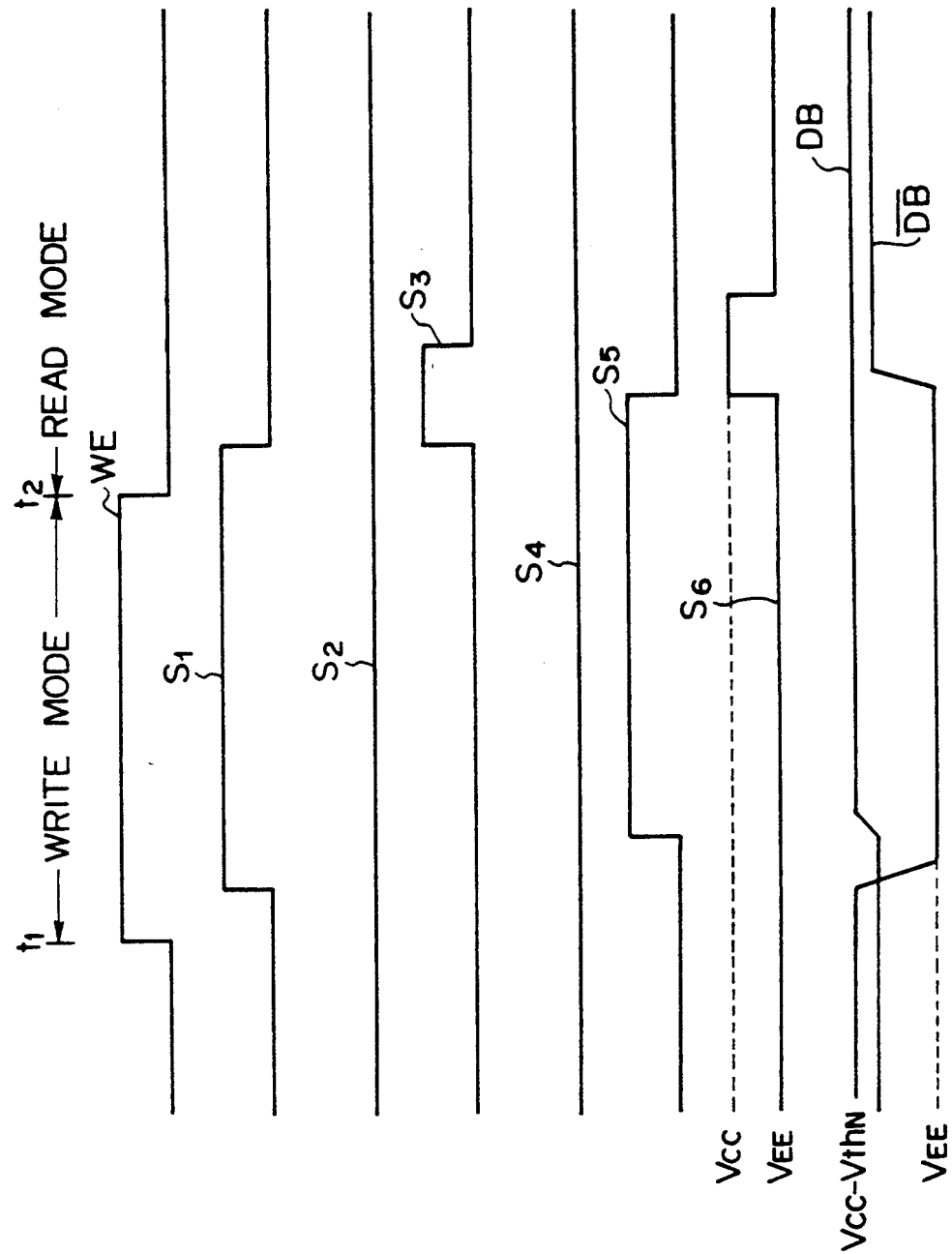
FIGS. 8A through 8H are timing diagrams for explaining the operation of the circuit of FIG. 7.

At time $t_1$, when the write control signal WE is made high as shown in FIG. 8A while the data signal DA is maintained the high level, so that the control enters a write mode, the AND circuit 71 generates a high level signal $S_1$ as shown in FIG. 8B, and the NOR circuit 76 continues to generate a low signal $S_2$ as shown in FIG. 8C. Also, the NOR circuit 77 continues to generate a low level signal $S_3$ as shown in FIG. 8D, and the AND circuit 72 continues to generate a low level signal $S_4$ as shown in FIG. 8E. Then, the transistor $Q_4$ is turned ON by the signal $S_1$, and the OR circuit 78 generates a high level signal $S_5$ as shown in FIG. 8F, to turn ON the transistor $Q_1$. On the other hand, the transistor $Q_2$ is maintained OFF by the signal $S_4$, and further, the Or circuit 79 continues to generate a low level signal $S_6$ as shown in FIG. 8G, to turn OFF the transistor $Q_3$. As a result the data bus DB is pulled up to $V_{CC}-V_{thN}$, and the data bus $\overline{DB}$ is pulled down to $V_{EE}$, to carry out a write operation, as shown in FIG. 8H.

In the above-mentioned state, at time $t_2$, when the write control signal WE is made low as shown in FIG. 8A, to move the control to a read mode, the signal $S_1$ of the AND circuit 71 is made low as shown in FIG. 8B, while the NOR circuit 76 continues to generate the low level output signal $S_2$ as shown in FIG. 8C, so that the NOR circuit 77 generates a high level output signal $S_3$ as shown in FIG. 8D having a duration corresponding to the operation delay time of the inverter 75, and subsequently, the AND circuit 72 continues to generate the low signal $S_4$ as shown in FIG. 8E. Then, the transistor $Q_4$ is turned OFF by the two low level signals $S_1$ and $S_2$, and the signal S of the OR circuit 78 is made low as shown in FIG. 8F, to turn OFF the transistor $Q_1$. Also, the transistor $Q_2$ is turned OFF by the output signal $S_4$ of the AND circuit 72, and the output signal $S_6$ of the OR circuit 79 is brought to a high level having a definite pulse-width, by the signal $S_3$ as shown in FIG. 8D. The transistor $Q_3$ is turned ON for this definite pulse width, so that the data bus $\overline{DB}$ is pulled up to $V_{CC}-V_{thN}$. As a result, the data bus DB, which is pulled down to $V_{EE}$ during a write mode, is pulled up to $V_{CC}-V_{thN}$ by the transistor $Q_3$ which is turned ON for a definite time period, as shown in FIG. 8H. Thus, the difference in potential of the data buses DB and $\overline{DB}$ is reduced.

On the other hand, when the data signal DA is low, the operations of the NOR circuits 76 and 77, i.e., the operations of the two fall detecting circuits (74, 76; 75, 77) are reversed, and the operations of the OR circuits 78 and 79 are reversed, and as a result, the potential at the data bus DB is pulled up.

Figure 9:
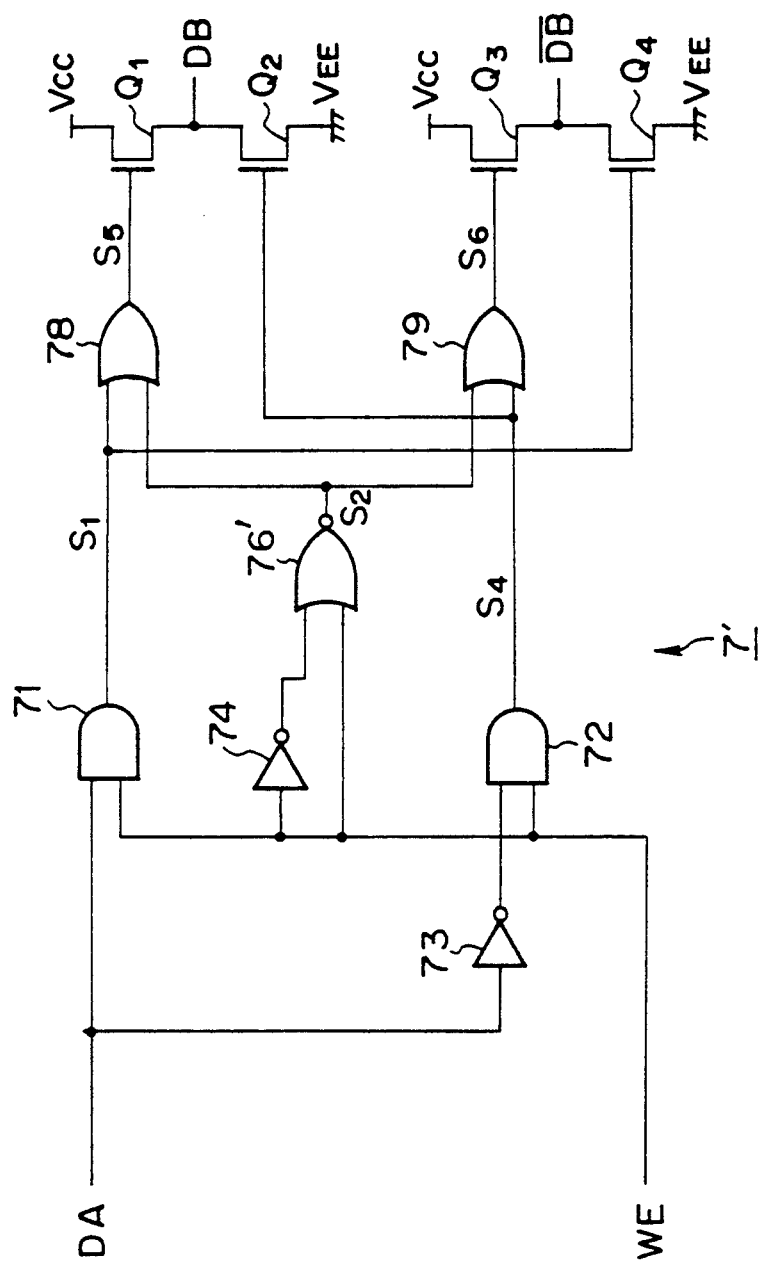
FIG. 9 is a circuit diagram illustrating a second embodiment of the write/restoring circuit according to the present invention.

In FIG. 9, which illustrates a second embodiment of the present invention, only one fall detecting circuit is formed by the inverter 74 and the NOR circuit 76. This fall detecting circuit detects a fall in the write control signal WE regardless of the data signal DA. The operation of the circuit of FIG. 9 is shown in FIGS. 10A through 10G, which correspond to FIGS. 8A, 8B, 8D through 8H, respectively.

That is, when the control enters a read mode, a pulse output signal $S_2$ of the NOR circuit 76 as shown in FIG. 10C is supplied via the OR circuits 78 and 79 to the transistors $Q_1$ and $Q_3$. Therefore, in this case, even when the potential at the data bus DB is high as shown in FIG. 10G, a pulling-up operation is performed upon the data bus DB as indicated by an arrow X in FIG. 10E. This is different from the operation of the circuit of FIG. 7, however, this creates no problem.

As explained above, the same write operation as in the prior art can be carried out by the write/restoring circuit 7', and further, when the write control signal WE is made low level to carry out a read operation, the output transistors of the write/restoring circuit 7, are operated for a predetermined time period, so that the data bus, which was pulled down to $V_{EE}$, is pulled up to $V_{CC}-V_{thN}$. Thus, the difference in potential of the data buses DB and $\overline{DB}$ is reduced to prepare a read operation. Therefore, the write circuit and the restoring circuit of the prior art are combined as one body, to thereby simplify the connections and increase the degree of integration. Particularly, although the small size circuits such as inverters, NOR circuits are required, the degree of integration can be improved, since the large scale transistors $Q_5$ and $Q_6$ of the restoring circuit 8 are unnecessary.

Also, since a write operation and its subsequent operation for reducing the difference in potential of the data buses DB and $\overline{DB}$ are carried out within the same circuit in accordance with the write control signal WE, it is easy to match the timings of the operations.

Note that, although the difference in potential during a write mode for the data buses is $V_{CC}-V_{thN}$ and the reduced difference in potential during a read mode is the difference between $V_{CC}-V_{thN}$ and $V_{CC}-V_{thN}-0.5$ V, these potentials can be set by the arbitrary circuit design method. Therefore, the present invention is effective for all kinds of potentials.

Further, the present invention can be applied to a MOS (broadly, MIS) static RAM.

I claim:

1. A semiconductor memory device wherein a difference in potential of first and second data buses is increased during a write mode to carry out a write operation, and the difference in potential of the first and second data buses is reduced during a read mode to carry out a read operation, comprising:

a first push-pull output buffer, operably connected to the first data bus, for charging and discharging the first data bus;

a second push-pull output buffer, operably connected to the second data bus, for charging and discharging the second data bus;

means, operably connected to said first and second push-pull output buffers, for operating said first and second push-pull output buffers to increase the difference in potential of the first and second data busses during the write mode, and for operating said first and second push-pull output buffers to reduce the difference in potential of the first and second data buses during the read mode.

2. A device as set forth in claim 1, wherein each of said first and second push-pull output buffers comprises a series of two transistors of the same type connected between power supply terminals.

3. A device as set forth in claim 2, wherein said transistors comprise N-channel MOS transistors.

4. A device as set forth in claim 2, wherein said means comprises:

a first AND circuit for receiving a data signal and a write control signal;

a second AND circuit for receiving an inverted signal of the data signal and the write control signal;

a first fall detecting circuit, operated by a low level potential of the data signal, for detecting a fall in the write control signal to generate a first definite duration signal;

a second fall detecting circuit, operated by a high level potential of the data signal, for detecting a fall in the write control signal to generate a second definite duration signal;

a first OR circuit, connected to outputs of said first AND circuit and said first fall detecting circuit, for generating an output signal to drive one of said transistors of said first push-pull output buffer on a side of a first power supply terminal; and a second OR circuit, connected to outputs of said second AND circuit and said second fall detecting circuit, for generating an output signal to drive one of said transistors of said second push-pull output buffer on the side of said first power supply terminal, the other transistor of said first push-pull output buffer on a side of a second power supply terminal being driven by an output signal of said second AND circuit, the other transistor of said second push-pull output buffer on the side of the second power supply terminal being driven by an output signal of said first AND circuit.

5. A device as set forth in claim 4, wherein said first fall detecting circuit comprises:

a first inverter for receiving the write control signal; and a first three-input NOR circuit, connected to an output of said first inverter, for receiving the output thereof, the data signal, and the write control signal to generate the first definite duration signal, and wherein said second fall detecting circuit comprises:

a second inverter for receiving the write control signal; and a second three-input NOR circuit, connected to an output of said second inverter, for receiving the output thereof, the data signal, and the write control signal to generate the second definite duration signal.

6. A device as set forth in claim 2, wherein said means comprises:

a first AND circuit for receiving a data signal and a write control signal;

a second AND circuit for receiving an inverted signal of the data signal and the write control signal;

a fall detecting circuit for detecting a fall in the write control signal to generate a definite duration signal;

a first OR circuit, connected to outputs of said first AND circuit and said fall detecting circuit, for generating an output signal to drive one of said transistors of said first push-pull output buffer on a side of a first power terminal; and a second OR circuit, connected to outputs of said second AND circuit and said fall detecting circuit, for generating an output signal to drive one of said transistors of said second push-pull output buffer on the side of said first power supply terminal, the other transistor of said first push-pull output buffer on a side of a second power supply terminal being driven by an output signal of said second AND circuit, the other transistor of said second push-pull output buffer on the side of the second power supply terminal being driven by an output signal of said first AND circuit.

7. A device as set forth in claim 6, wherein said fall detecting circuit comprises:

an inverter for receiving the write control signal; and a two-input NOR circuit, connected to an output of said inverter, for receiving the output thereof, the data signal, and the write control signal to generate the definite duration signal.

8. A device as set forth in claim 1, wherein said amplitude limiting circuit comprises:

a buffer for receiving the write control signal;

an NOR circuit having an input connected to an output of said buffer and another input for receiving a write control signal;

a first transistor, connected between the first power supply terminal and the first data bus; and a second transistor, connected between the first power supply terminal and the second data bus, said first and second transistors being controlled by an output of said NOR circuit.

9. A device as set forth in claim 8, wherein said first and second transistors comprise N-channel MOS transistors.

10. A device as set forth in claim 1, further comprising an amplitude limiting circuit, connected to the first and second data buses, for maintaining the reduced difference in potential of the first and second data buses during the read mode.

11. A semiconductor memory device comprising:

a pair of data buses which is commonly used during a write mode and during a read mode;

a write circuit, connected to said data buses, for generating two complementary signals in response to write data; and a control circuit, connected to said write circuit, for reducing the difference in potential between said data buses by temporarily making output potentials of said write circuit substantially at the same level in response to a switching from the write mode to the read mode.

* * * * *